US008524423B2

(12) United States Patent
Chiang et al.

(10) Patent No.: US 8,524,423 B2
(45) Date of Patent: Sep. 3, 2013

(54) METHOD OF FORMING ASSIST FEATURE PATTERNS

(75) Inventors: Yi-Chih Chiang, Tainan (TW); Yuan-Chi Pai, Tainan (TW); Sho-Shen Lee, New Taipei (TW); Yi-Ting Chen, Kaohsiung (TW); Tuan-Yen Yu, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 174 days.

(21) Appl. No.: 13/180,523

(22) Filed: Jul. 11, 2011

(65) Prior Publication Data

US 2013/0017474 A1    Jan. 17, 2013

(51) Int. Cl.
*G03F 1/36*        (2012.01)
(52) U.S. Cl.
USPC ............................................................ 430/5
(58) Field of Classification Search
USPC ............................................................ 430/5
See application file for complete search history.

(56) References Cited

U.S. PATENT DOCUMENTS

| 5,821,014 | A | 10/1998 | Chen et al. | |
|---|---|---|---|---|
| 6,934,010 | B2 | 8/2005 | Smith | |
| 2002/0177048 | A1* | 11/2002 | Saitoh et al. | 430/5 |
| 2002/0192570 | A1 | 12/2002 | Smith | |
| 2003/0149956 | A1* | 8/2003 | Singh et al. | 716/51 |
| 2004/0194050 | A1 | 9/2004 | Hwang et al. | |
| 2007/0105023 | A1* | 5/2007 | Zhou et al. | 430/5 |

* cited by examiner

*Primary Examiner* — Mark F Huff
*Assistant Examiner* — John S Ruggles
(74) *Attorney, Agent, or Firm* — Winston Hsu; Scott Margo

(57) ABSTRACT

A method of forming assist feature patterns includes providing an original layout pattern having at least a first region defined therein, the first region having a first light transmission rate larger than 0%; performing a search step to the original layout pattern to define at least a second region having a second light transmission rate equal to 0% in the original layout pattern; forming a plurality of assist features in the second region to increase the second light transmission rate to larger than 0%; and outputting the original layout pattern and the assist features to a reticle blank.

16 Claims, 6 Drawing Sheets

METHOD OF FORMING ASSIST FEATURE PATTERNS

BACKGROUND OF THE INVENTION

1. Field of the Invention

The present invention generally relates to a method for forming assist feature patterns, and more particularly, to a method for forming assist feature patterns that are able to reduce reticle heating and to mitigate reticle distortion in the photolithography.

2. Description of the Prior Art

Integrated circuit (IC) is constructed by devices and interconnections, which are formed by patterned feature in different layers. In the fabrication of IC, photolithography has been an essential technique. The photolithography is to form designed patterns such as implantation patterns or layout patterns on at least a photomask, and then to precisely transfer such patterns to a photoresist layer by exposure and development steps. Subsequently, by performing semiconductor processes such as ion implantation, etching process, or deposition, the complicated and sophisticated IC structure is obtained.

During the exposure step, a photoresist layer is spinned—on a wafer, and a photomask is exposed to deep UV lights to form latent images in the photoresist layer. And the exposed portion or unexposed portions are removed during the development step subsequently to the exposure step depending on the types of the photoresist layer (positive or negative). Thus the patterns on the photomask are transferred to the photoresist layer.

As mentioned above, the photomask is exposed to deep UV lights such as 248 nanometer (hereinafter abbreviated as nm) KrF deep UV or 193 nm deep UV in the exposure step. Typically, the deep UV forms the latent images in the photoresist layer through portion of the photomask, such as portions having great light transmission rate. However, at portions having lower light transmission rate, the photomask absorbs energy from the exposing light, resulting in reticle heating. The reticle heating causes thermal expansion and an undesirable problem: reticle distortion. As a result, the reticle will increase overall in temperature and this increase may be uneven and causing unpredictable and non-correctable distortion.

It is noteworthy that since the IC critical dimension is keeping shrinking, requirement to resolution and overlay control of the photolithography are getting stricter and stricter. During fabrication, the effects of reticle heating can be evaluated as a function of heat induced overlay error that renders severely adverse impact to pattern transfer accuracy and process yield.

SUMMARY OF THE INVENTION

According to an aspect of the present invention, a method of forming assist feature patterns is provided. The method includes providing an original layout pattern having at least a first region defined therein, the first region having a first light transmission rate, and the first light transmission rate is larger than 0%; performing a search step to the original layout pattern to define at least a second region in the original layout pattern, the second region having a second light transmission rate equal to 0%; forming a plurality of assist features in the second region to increase the second light transmission rate to larger than 0%; and outputting the original layout pattern and the assist features to a reticle blank.

According to another aspect of the present invention, a method of forming assist feature patterns is provided. The method includes providing an original layout pattern having at least a first region defined therein, the first region having a first light transmission rate; performing a search step to define at least a second region in the original layout pattern, the second region having a second light transmission rate, and the second light transmission rate being equal to 100%; forming a plurality of assist features in the second region to adjust the second light transmission rate to approach the first light transmission rate; and outputting the original layout pattern and the assist features to a reticle blank.

According to the method for forming assist feature patterns provided by the present invention, the assist features are formed in the original layout pattern, particularly in portions having transmission rate equal to 0%. Accordingly, the light transmission rate is increased to larger than 0% or equal to the light transmission rate of other regions. Subsequently, the original layout pattern and the assist features are outputted to a reticle blank. Therefore, the lower light transmission rate is raised due to the formation of the assist features, and the reticle heating and reticle distortion issue that used to occur at the region having lower light transmission rate are reduced. Furthermore, since the light transmission rates of different regions are averaged due to the assist features, reticle heating is consequently averaged. The even reticle heating makes reticle distortion more predictable and thus improves the overlay compensation for the reticle.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-5A are schematic drawings illustrating a method for forming assist feature patterns provided by a first preferred embodiment of the present invention; wherein FIG. 2 is a schematic drawing illustrating a step subsequent to FIG. 1;

FIG. 3 is a schematic drawing illustrating a step subsequent to FIG. 2;

FIG. 5A is a schematic drawing illustrating a step subsequent to FIG. 4A.

FIGS. 4B-5B are schematic drawings illustrating a comparison to the preferred embodiment, wherein FIG. 5B is a schematic drawing illustrating a step subsequent to FIG. 4B.

FIGS. 6-8 are schematic drawings illustrating a method for forming assist feature patterns provided by a second preferred embodiment of the present invention; wherein FIG. 7 is a schematic drawing illustrating a step subsequent to FIG. 6; and FIG. 8 is a schematic drawing illustrating a step subsequent to FIG. 7.

DETAILED DESCRIPTION

Figure 1:
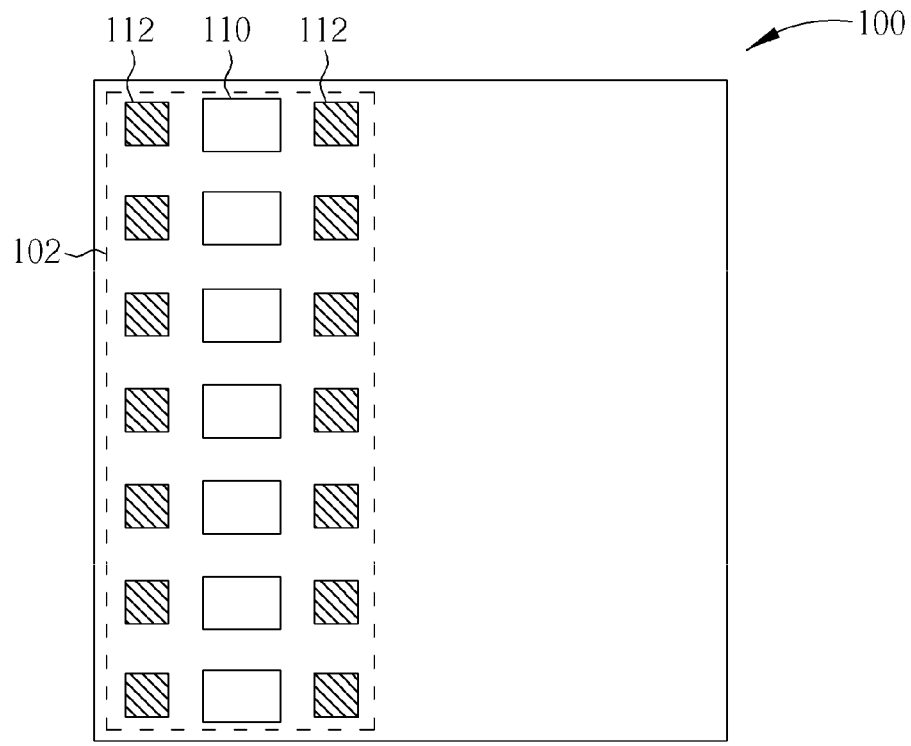

Please refer to FIGS. 1-5A, which are schematic drawings illustrating a method for forming assist feature patterns provided by a first preferred embodiment of the present invention. It is noteworthy that since "reticle" frequently is used interchangeably with "mask" in the art, it will be understood that "reticle" and "reticle blank" as used herein encompass "mask" and "mask blank," respectively, as these terms are encountered in the art. As shown in FIG. 1, the method for forming assist feature patterns of the preferred embodiment first provides an original layout pattern 100 from a data base. The original layout pattern 100 includes a plurality of printable features, and the printable features can include feature patterns 110 used to construct IC, such as doped region patterns, device patterns, or line patterns. The printable features can also include first dummy patterns 112 not used to form IC but required by the processes. For example, the prior art used to form a plurality of first dummy patterns 112 in the original layout pattern 100 for solving dishing issue that usually occurs in the planarization process. However, those skilled in the art would easily realize that the first dummy patterns 112 can be formed according to different process requirements. Therefore, shapes and sizes of the first dummy patterns 112 are not limited to those illustrated in FIG. 1.

It is also well-known that an optical proximity correction (hereinafter abbreviated as OPC) is performed to the original layout pattern 100 after obtaining the original layout pattern 100. The OPC is performed to correct the feature patterns 110 and the first dummy patterns 112. More important, for mitigating optical proximity effect (OPE) that occurs in the exposure step, the OPC further inserts a plurality of non-printable features, such as the second dummy patterns 130 shown in FIG. 6 in the original layout pattern 100. Though the second dummy patterns 130 are not transferred to the object layer such as the photoresist layer during the exposure step, the second dummy patterns 130 are formed to compensate the optical proximity effect and to improve pattern transfer result of the original layout pattern 100.

Please still refer to FIG. 1. A region having the feature patterns 110, the first dummy patterns 112 and the second dummy patterns 130 are specifically defined as a first region 102 in the original layout pattern 100. In the words, the original layout pattern 100 includes at least a first region 102, and the first region 102 includes the abovementioned printable features and non-printable features. It is noteworthy that the first region 102 has a first light transmission rate and the first light transmission rate of the first region 102 is larger than 0% due to the printable features and the non-printable features positioned in the first region 102.

Figure 2:
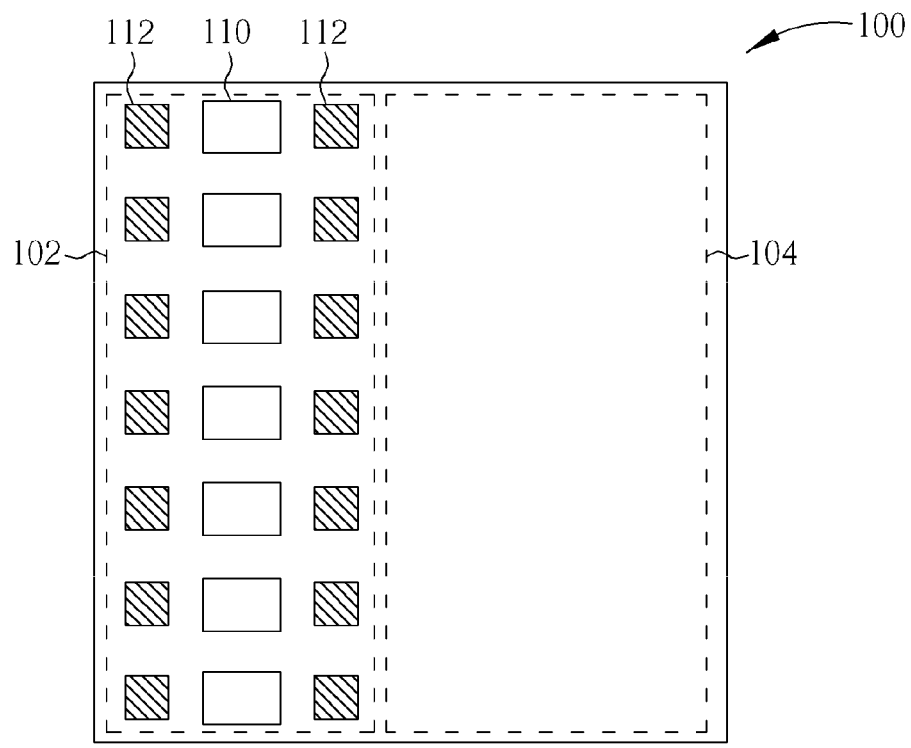

Please refer FIG. 2. Then, a searching step is performed. The search step is to search regions having no patterns positioned therein in the original layout pattern 100. Since such region does not include any patterns, a light transmission rate of the specific region is equal to 0% and the specific region is defined as a second region 104. In other words, the original layout pattern 100 includes at least a second region 104 having a second light transmission rate, and the second light transmission rate is equal to 0%. Accordingly, the original layout pattern 100 provided by the preferred embodiment includes both the first region 102 and the second region 104, the first light transmission rate of the first region 102 is larger than 0% due to the patterns positioned therein, and the second light transmission rate of the second region 104 is equal to 0% due to no patterns positioned therein. Furthermore, the second region 104 is defined beyond the first region 102 as shown in FIG. 2 in the preferred embodiment.

Figure 3:
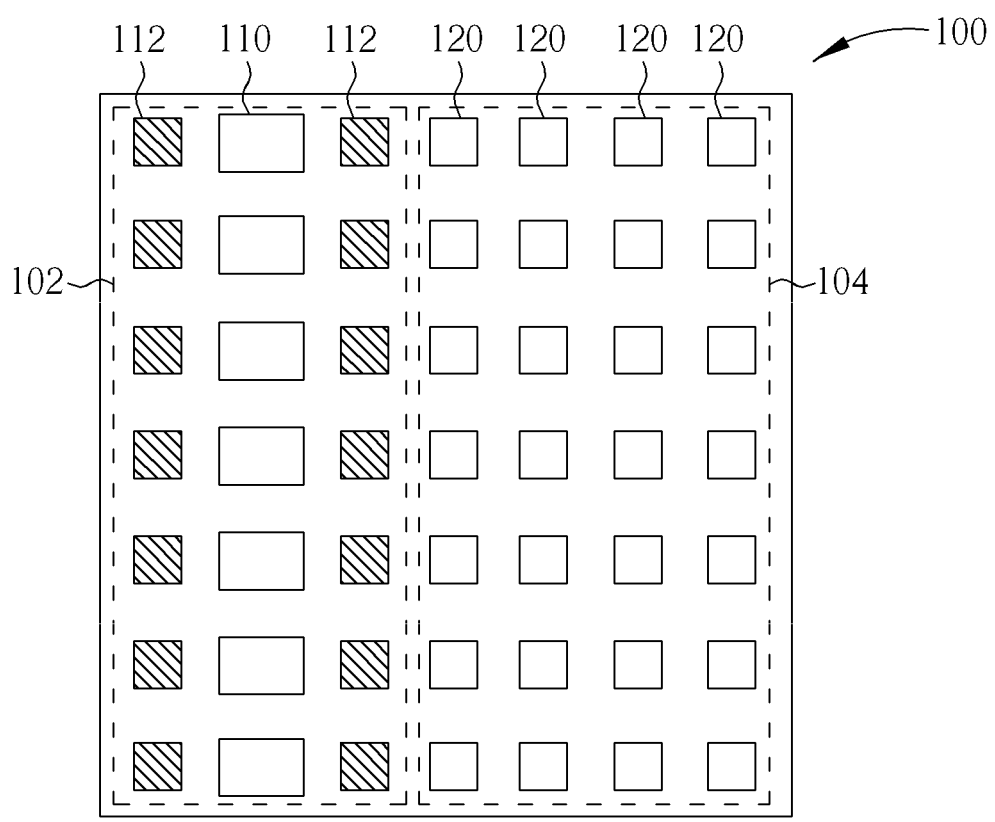
Figure 6:
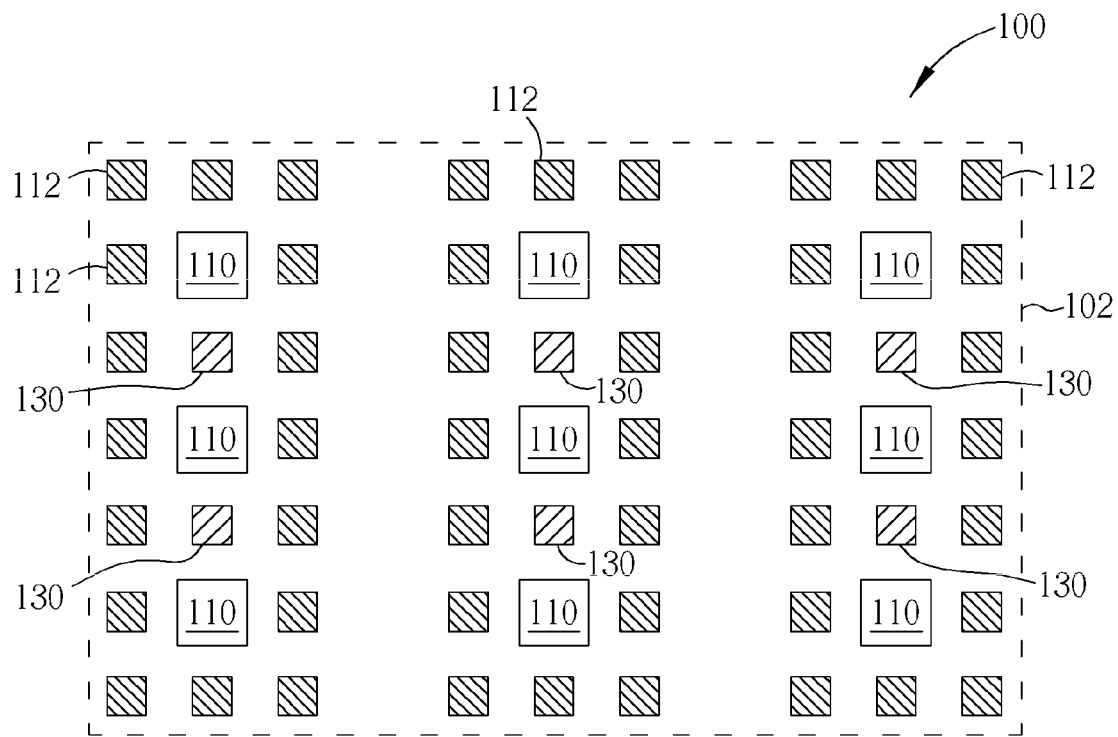

Please refer to FIG. 3. After defining the first region 102 having the first light transmission rate larger than 0% due to the feature patterns 110 and the dummy patterns (including the first dummy patterns 112 and the second dummy patterns 130, which are shown in FIG. 6) positioned therein and the second region 104 having the second light transmission rate equal to 0% due to no patterns positioned therein, the preferred embodiment is to form a plurality of assist features 120 in the second region 104. The assist features 120 include polygons and preferably, but not limited to, include squares. It is noteworthy that the assist features 120 are non-printable features and a size of the assist features can be different depending on the required line width and optical set-up. More important, due to the assist features 120, the second light transmission rate of the second region 104 is increased to larger than 0%. For example, by forming the assist features 120, the second light transmission rate of the second region 104 is increased to larger than 0% and smaller than or equal to the first light transmission rate of the first region 102. In a more preferred condition, the second light transmission rate of the second region 104 is increased to substantially equal to the first light transmission rate of the first region 102 by adjusting the amounts of the assist features 120.

Figure 4A:
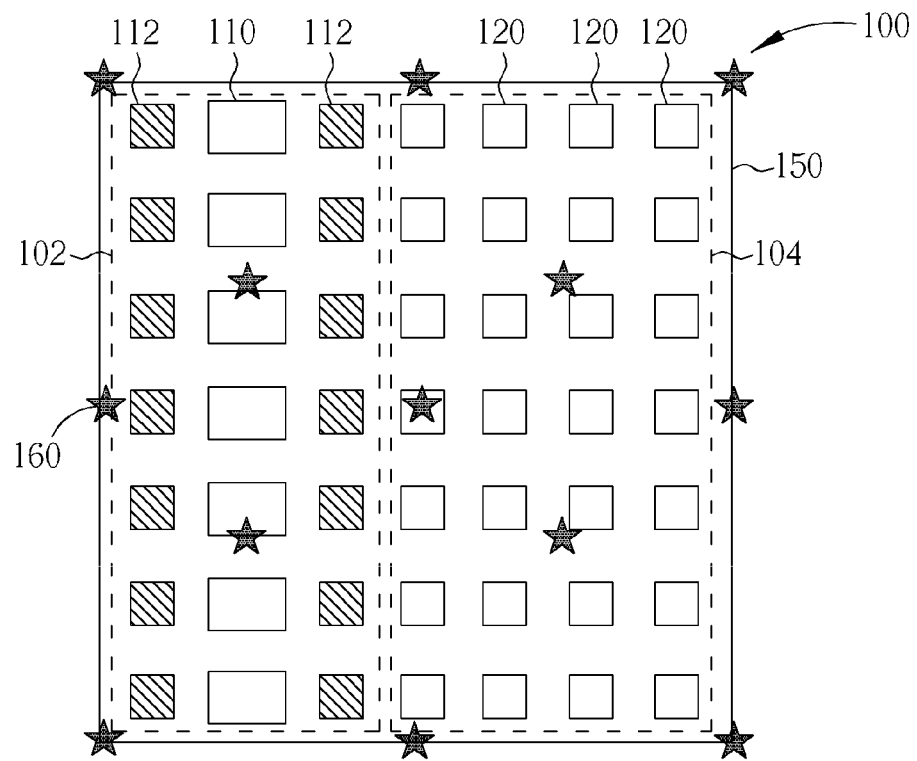
FIG. 4A is a schematic drawing illustrating a step subsequent to FIG. 3.

Please refer to FIG. 4A. After inserting the abovementioned assist features 120 in the original layout pattern 100, the original layout pattern 100 and the assist features 120 are outputted to a reticle blank to form a reticle 150 and followed by performing an exposure step of a photolithography.

Figure 4B:
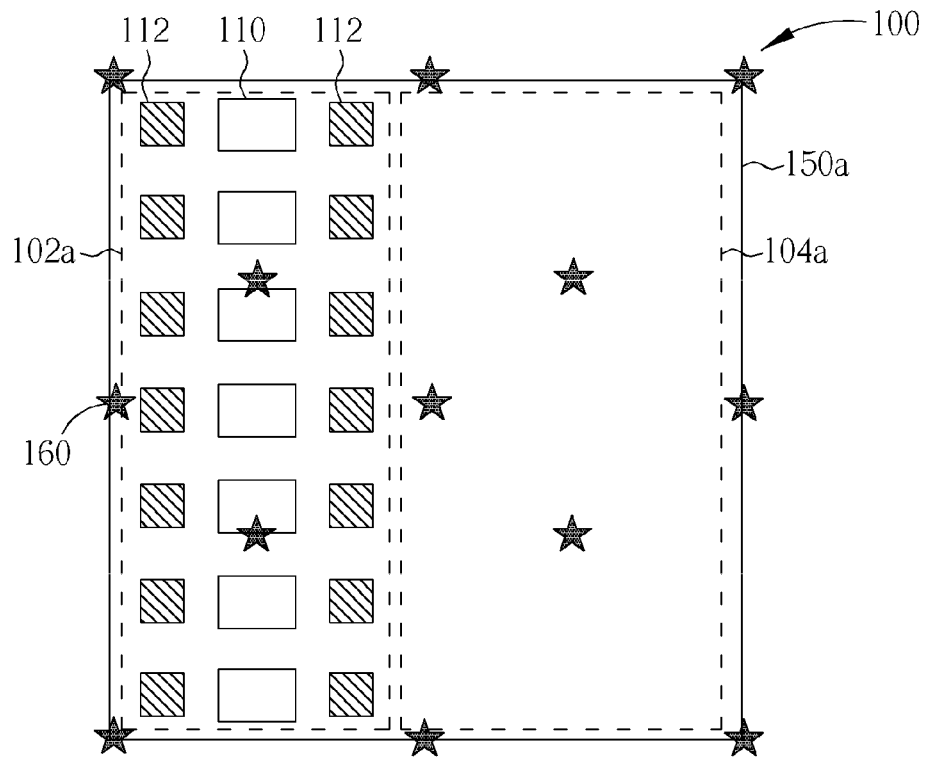
Figure 7:
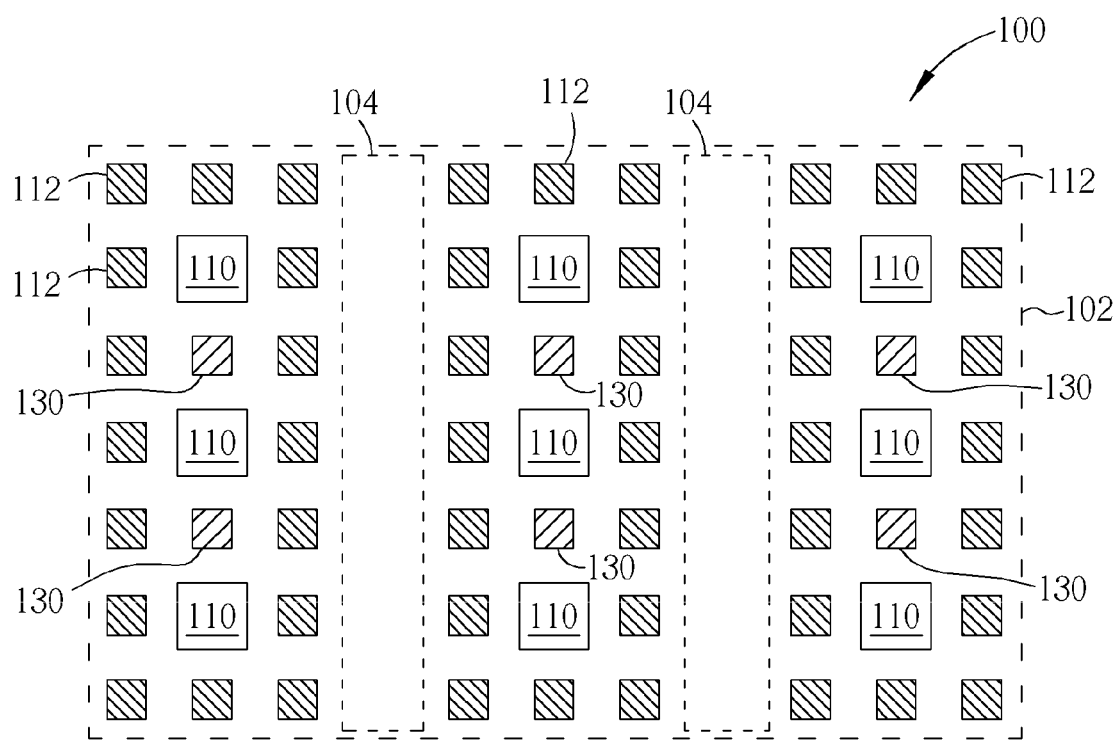

Please refer to FIGS. 4B-5B, wherein FIGS. 4B-5B are schematic drawings illustrating a comparison to the preferred embodiment. As shown in FIG. 4B, the comparison to the preferred embodiment provides a comparison reticle 150a having the feature patterns 110 and the dummy patterns (including the first dummy patterns 112 and the second dummy patterns 130, which are shown in FIG. 7) that are completely identical to the preferred embodiment. The difference between the first preferred embodiment and the comparison is: the comparison reticle 150a never includes any assist features after forming the feature patterns 110 and the first dummy patterns 112 and performing the OPC, which inserts the second dummy patterns 130 as shown in FIG. 7. In other words, the comparison reticle 150a also includes a comparison first region 102a and a comparison second region 104a, the comparison first region 102a has a first light transmission rate and the comparison second region 104a includes a second light transmission rate. The first light transmission rate of the comparison first region 102a is identical to the first light transmission rate of the first region 102 provided by the preferred embodiment. However, the second light transmission rate of the comparison second region 104a is equal to 0%, that is different from the preferred embodiment As mentioned above, during the exposure step, the reticle 150 and the comparison reticle 150a are both exposed to the 248 nm or 193 nm deep UV light. Therefore, regions having lower light transmission rate absorb more energy from the light. Accordingly, the light transmission rate of different regions in the reticle 150 and the comparison reticle 150a decisively affect the reticle heating. In the preferred embodiment and the comparison, detecting points 160 are designated to different regions of the reticle 150 and the comparison reticle 150a for detecting overlay error and monitoring reticle heating of the reticle 150 and the comparison reticle 150a. Those skilled in the art would easily realize the amounts and positions of the detecting points shown in FIGS. 4A and 4B are exemplarily provided, but not limited to this. The preferred embodiment further provides a overlay control compensation, which is to predict the reticle distortion to the reticle 150 and the comparison reticle 150a by monitoring the temperature of the reticle 150 and the comparison reticle 150a and to calculate a compensation value corresponding to the reticle distortion to the reticle 150 and the comparison reticle 150a. The compensation value then is feedback to adjust the exposure process or following processes.

Please still refer to FIG. 4A and FIG. 4B. As mentioned above, since the assist features 120 are added in the regions of which an original second light transmission rate is 0% for increasing the second light transmission rate to larger than 0%, or preferably equal to the first light transmission rate of the first region 102, light transmission rates are averaged in the reticle 150, and reticle heating and reticle distortion are consequently averaged. Different from the preferred embodiment, the first light transmission rate of the first comparison region 102a of the comparison reticle 150a is larger than 0%, thus the first comparison region 102a is slightly heated. However since the second light transmission rate of the second comparison region 104a of the comparison reticle 150a is equal to 0%, the second comparison region 104a is heavily heated. In other words, because the light transmission rates of the comparison reticle 150a are not averaged, reticle heating to the different regions of the comparison reticle 150a is not even and the reticle distortion to the comparison reticle 150a is not uniform.

Figure 5A:
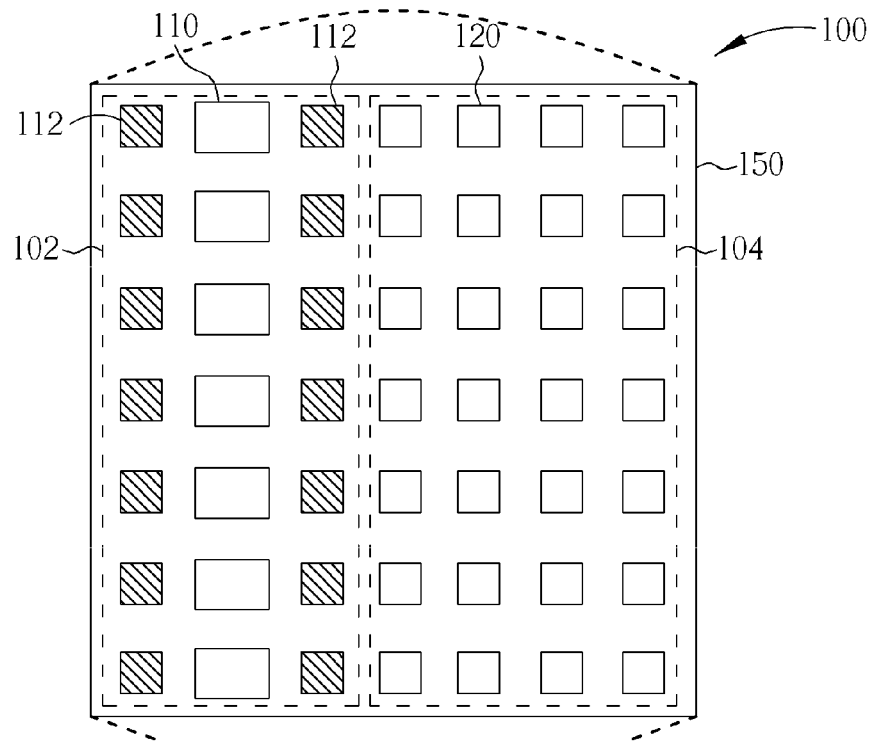
Figure 5B:
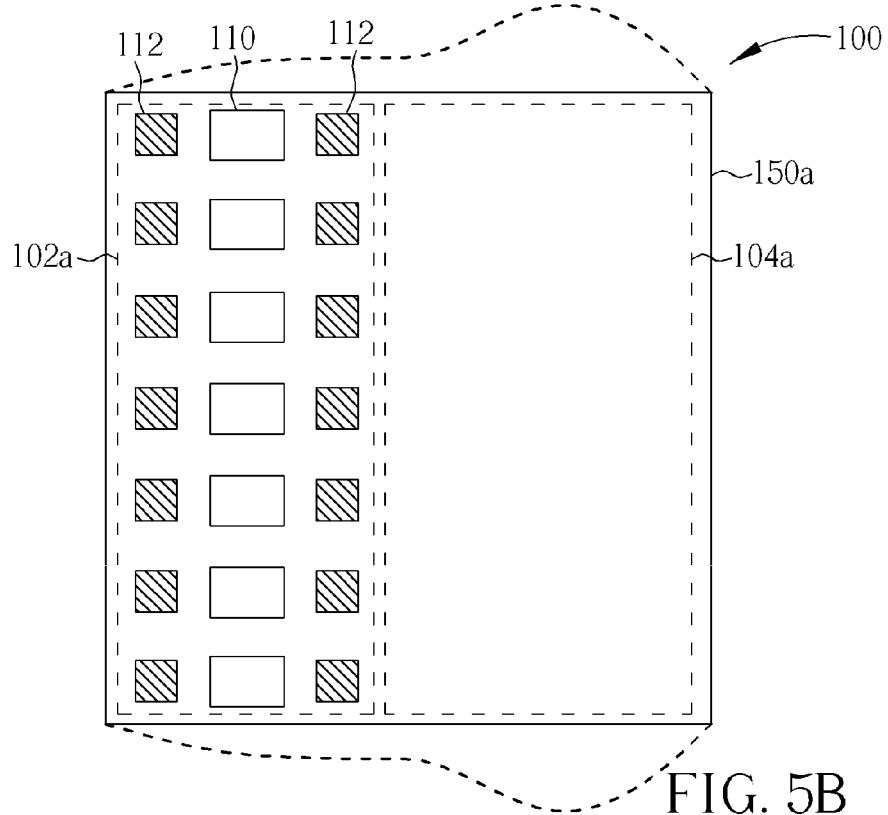

Please refer to FIG. 5A and FIG. 5B. As mentioned above, since the light transmission rates of the reticle 150 are averaged, the reticle heating and the reticle distortion to the reticle 150 are both uniformed. Consequently, the overlay control compensation obtains a compensation value of higher accuracy. Furthermore, the overlay control compensation is performed to the entire reticle 150 as shown in FIG. 5A, thus the complexity of the overlay control compensation is reduced. Different from the preferred embodiment, because the light transmission rates of the comparison reticle 150a are not averaged, reticle heating and the reticle distortion are not uniformed, and thus the complexity of the overlay control compensation is increased, even cause the compensation error. Also, the uneven reticle distortion not only increases the complexity of the overlay control compensation, but also lowers the accuracy of the overlay control compensation.

According to the method of forming the assist features provided by the first preferred embodiment, regions having light transmission rate equal to 0% is searched out and defined after forming any conventional printable features or non-printable features such as the second dummy patterns 130 by performing the OPC. Subsequently, the assist features 120 are inserted to the region to increase the light transmission rate to larger than 0%, or to equal to the light transmission rate of other regions having patterns in the original layout pattern 100. Then, the original layout pattern 100 and the assist features 130 are outputted to the reticle blank to form the reticle 150. Accordingly, regions of the reticle 150 including the original layout pattern 100 and the assist features 130 obtain uniform light transmission rates, and thus reticle heating is averaged. As mentioned above, therefore, the complexity of the overlay control compensation is reduced while the accuracy of the overlay control compensation is improved.

Figure 8:
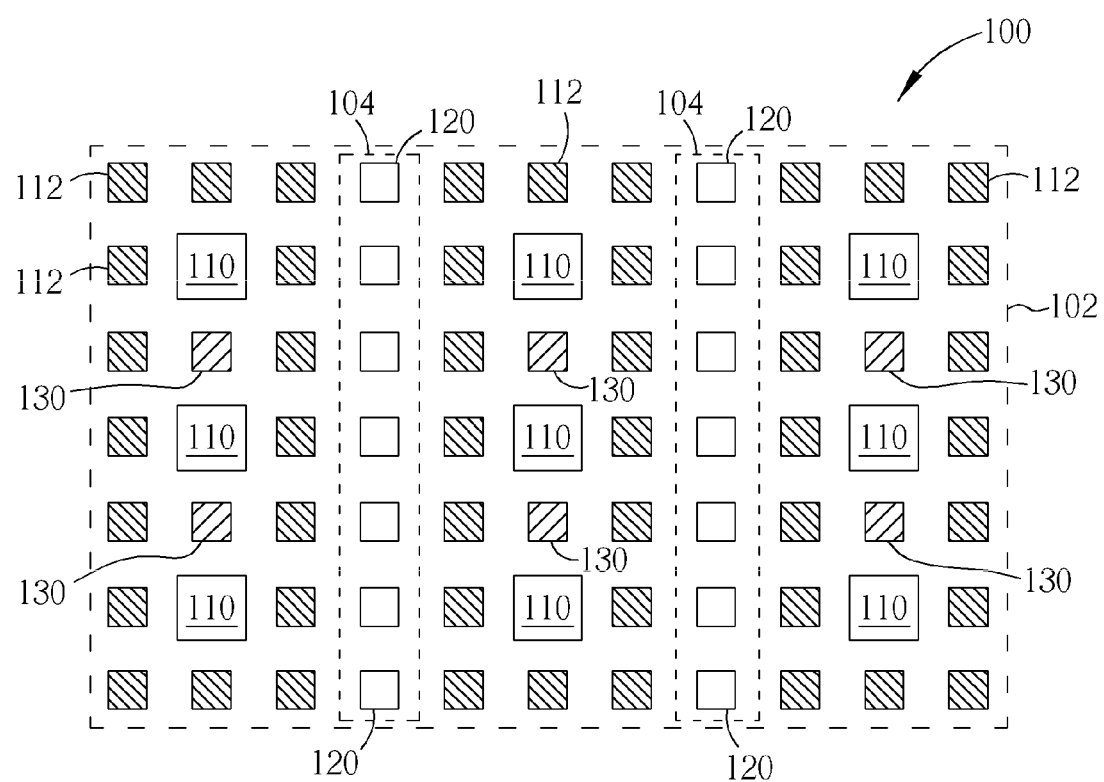

Please refer to FIGS. 6-8, which are schematic drawings illustrating a method for forming assist feature patterns provided by a second preferred embodiment of the present invention. It is noteworthy that elements the same in both first and second preferred embodiment are designated by the same numerals. As shown in FIG. 6, the method for forming assist feature patterns of the preferred embodiment first provides an original layout pattern 100 from a data base. The original layout pattern 100 includes a plurality of printable features, and the printable features can include feature patterns 110 used to construct IC, such as doped region patterns, device patterns, or line patterns. The printable features can also include first dummy patterns 112 not used to form IC but required by the processes.

It is also well-known that an OPC is performed to the original layout pattern 100 after obtaining the original layout pattern 100. The OPC is performed to correct the feature patterns 110 and the first dummy patterns 112. More important, for mitigating optical proximity effect that occurs in the exposure step, the OPC further inserts a plurality of non-printable features, such as the second dummy patterns 130 shown in FIG. 6 in the original layout pattern 100. Though the second dummy patterns 130 are not transferred to the object layer such as the photoresist layer during the exposure step, the second dummy patterns 130 are formed to compensate the optical proximity effect and to improve pattern transfer result of the original layout pattern 100.

Please still refer to FIG. 6. A region having the feature patterns 110, the first dummy patterns 112 and the second dummy patterns 130 are specifically defined as a first region 102 in the original layout pattern 100. In the words, the original layout pattern 100 includes at least a first region 102, and the first region 102 includes the abovementioned printable features and non-printable features. It is noteworthy that the first region 102 has a first light transmission rate and the first light transmission rate of the first region 102 is larger than 0% due to the printable features and the non-printable features positioned in the first region 102.

Please refer FIG. 7. Then, a searching step is performed. The search step is to search regions having no patterns positioned therein in the original layout pattern 100. Since such region does not include any patterns, a light transmission rate of the specific region is equal to 0% and the specific region is defined as a second region 104. In other words, the original layout pattern 100 includes at least a second region 104 having a second light transmission rate, and the second light transmission rate is equal to 0%. Accordingly, the original layout pattern 100 provided by the preferred embodiment includes both the first region 102 and the second region 104, the first light transmission rate of the first region 102 is larger than 0% due to the patterns positioned therein, and the second light transmission rate of the second region 104 is equal to 0% due to no patterns positioned therein. It is noteworthy that since the complexity of the original layout pattern 100 is increased, the second region 104 can be searched out and defined within the first region 102 as shown in FIG. 7.

Please refer to FIG. 8. After defining the first region 102 having the first light transmission rate larger than 0% due to the feature patterns 110 and the dummy patterns (including the first dummy patterns 112 and the second dummy patterns 130) positioned therein and the second region 104 having the second light transmission rate equal to 0% due to no patterns positioned therein, the preferred embodiment is to form a plurality of assist features 120 in the second region 104. The assist features 120 include polygons and preferably, but not limited to, include squares. It is noteworthy that the assist features 120 are non-printable features. As mentioned above, a size of the assist features can be different depending on the required line width and optical set-up. More important, due to the assist features 120, the second light transmission rate of the second region 104 is increased to larger than 0%. For example, by forming the assist features 120, the second light transmission rate of the second region 104 is increased to larger than 0% and smaller than or equal to the first light transmission rate of the first region 102. In a more preferred condition, the second light transmission rate of the second region 104 is increased to substantially equal to the first light transmission rate of the first region 102 by adjusting the amounts of the assist features 120.

After inserting the abovementioned assist features 120 in the original layout pattern 100, the original layout pattern 100 and the assist features 120 are outputted to a reticle blank to form a reticle 150 and followed by performing an exposure step of a photolithography. Since the exposure step and the overlay control compensation are performed as mentioned in the first preferred embodiment, those details are omitted herein in the interest of brevity.

According to the method of forming the assist features provided by the second preferred embodiment, regions having light transmission rate equal to 0% is searched out and defined after forming any conventional printable features or non-printable features such as the second dummy patterns 130 by performing the OPC. Subsequently, the assist features 120 are inserted to the region to increase the light transmission rate to larger than 0%, or to be equal to the light transmission rate of other regions having patterns in the original layout pattern 100. Then, the original layout pattern 100 and the assist features 130 are outputed to the reticle blank to form the reticle 150. Accordingly, the regions of reticle 150 including the original layout pattern 100 and the assist features 130 obtain uniform light transmission rates, and thus reticle heating is averaged. Therefore the complexity of the overlay control compensation is reduced while the accuracy of the overlay control compensation is improved. It is noteworthy that with the progress of the semiconductor fabrication, the complexity of the original layout pattern 100 is getting more and more. Therefore a single reticle may include regions of different light transmission rates. When performing the overlay control compensation, the complexity is consequently increased while the accuracy of the overlay control compensation is lowered. As a countermeasure against to the problems, the preferred embodiment further searches out and defines the second region 104 having the light transmission rate of 0% within the first region 102 and adding the assist features for increasing the light transmission rate. Thus the light transmission rates of regions of the original layout pattern 100 are averaged for reducing the complexity of the overlay control compensation and improve the accuracy of the overlay control compensation.

Additionally, though the abovementioned first and second preferred embodiments are used to form the reticle for the positive photoresist, the present invention can be also used to form the reticle for the negative photoresist. Accordingly, the first region having the feature patterns and the dummy patterns is defined in the original layout pattern. The first region has a first light transmission rate, and the first light transmission rate is smaller than 100%. Next, a search step is performed to search out and define a second region in the original layout pattern. The second region has a second light transmission rate, and the second light transmission rate has a maximal light transmission rate. For example, the maximal light transmission rate is 100% after deducting the refractive index and the reflective index of the reticle blank. After searching out and defining the second region, a plurality of assist features is formed in the second region to reduce the second light transmission rate to be smaller than 100%, and to approach the first light transmission rate. Subsequently, the original layout pattern and the assist features are outputed to a reticle blank. Thus the light transmission rates of the original layout pattern are averaged. Consequently the complexity of the overlay control compensation is reduced and the accuracy of the overlay control compensation is improved.

According to the method for forming assist feature patterns provided by the present invention, the assist features are formed in the original layout pattern, particularly in portions having transmission rate equal to 0%. Accordingly, the light transmission rate is increased to larger than 0% or equal to the light transmission rate of other regions. Subsequently, the original layout pattern and the assist features are outputed to a reticle blank. Therefore, the lower light transmission rate is raised due to the assist features, and the reticle heating and reticle distortion issue that used to occur at the region having lower light transmission rate are reduced. Furthermore, since the light transmission rates of different regions are averaged due to the assist features, reticle heating is consequently averaged. The even reticle heating makes reticle distortion more predictable and thus improves the compensation for the reticle.

Those skilled in the art will readily observe that numerous modifications and alterations of the device and method may be made while retaining the teachings of the invention.

What is claimed is:

1. A semiconductor photolithography reticle forming method comprising:
   providing an original layout pattern having at least a first region defined therein, the first region having a first light transmission rate and the first light transmission rate being larger than 0%;
   performing a search step on the original layout pattern to define at least a second region in the original layout pattern, the second region having a second light transmission rate and the second light transmission rate being equal to 0%;
   forming a plurality of assist features in the second region to increase the second light transmission rate to larger than 0% to mitigate reticle distortion in photolithography, wherein the increased second light transmission rate is smaller than or equal to the first light transmission rate; and
   outputting a resulting layout pattern that includes the plurality of assist features onto a reticle blank to form a reticle.

2. The semiconductor photolithography reticle forming method according to claim 1, wherein the second region is defined beyond the first region.

3. The semiconductor photolithography reticle forming method according to claim 1, wherein the second region is defined within the first region.

4. The semiconductor photolithography reticle forming method according to claim 1, wherein the plurality of assist features are non-printable features.

5. The semiconductor photolithography reticle forming method according to claim 1, wherein the increased second light transmission rate is equal to the first light transmission rate after forming of the plurality of assist features.

6. The semiconductor photolithography reticle forming method according to claim 1, further comprising performing an optical proximity correction (OPC) before forming of the plurality of assist features.

7. The semiconductor photolithography reticle forming method according to claim 1, wherein the first region further comprises a plurality of printable features formed therein.

8. The semiconductor photolithography reticle forming method according to claim 7, wherein the plurality of printable features comprise doped region patterns, device patterns, line patterns, or first dummy patterns.

9. The semiconductor photolithography reticle forming method according to claim 1, wherein the first region further comprises a plurality of non-printable features formed therein.

10. The semiconductor photolithography reticle forming method according to claim 9, wherein the plurality of non-printable features comprise second dummy patterns.

11. A semiconductor photolithography reticle forming method comprising:
    providing an original layout pattern having at least a first region defined therein, the first region having a first light transmission rate;

performing a search step to define at least a second region in the original layout pattern, the second region having a second light transmission rate and the second light transmission rate being equal to 100%;

forming a plurality of assist features in the second region to adjust the second light transmission rate to approach the first light transmission rate to mitigate reticle distortion in photolithography, wherein the adjusted second light transmission rate is smaller than 100%, and wherein the adjusted second light transmission rate is larger than or equal to the first light transmission rate; and outputting a resulting layout pattern that includes the plurality of assist features onto a reticle blank to form a reticle.

12. The semiconductor photolithography reticle forming method according to claim 11, wherein the second region is defined beyond or within the first region.

13. The semiconductor photolithography reticle forming method according to claim 11, wherein the plurality of assist features are non-printable features.

14. The semiconductor photolithography reticle forming method according to claim 11, wherein the first region further comprises a plurality of printable features and non-printable features.

15. The semiconductor photolithography reticle forming method according to claim 14, wherein the plurality of printable features comprise doped region patterns, device patterns, line patterns, or first dummy patterns.

16. The semiconductor photolithography reticle forming method according to claim 14, wherein the plurality of non-printable features comprise second dummy patterns.

* * * * *